United States Patent [19]

Kwon et al.

[11] Patent Number: 5,070,297
[45] Date of Patent: Dec. 3, 1991

[54] FULL WAFER INTEGRATED CIRCUIT TESTING DEVICE

[75] Inventors: Oh-Kyong Kwon, Plano; Masashi Hashimoto; Satwinder Malhi, both of Garland; Eng C. Born, Richardson, all of Tex.

[73] Assignee: Texas Instruments Incorporated, Dallas, Tex.

[21] Appl. No.: 532,481

[22] Filed: Jun. 4, 1990

[51] Int. Cl.⁵ .............................................. G01R 31/02
[52] U.S. Cl. ............................ 324/158 P; 324/158 F
[58] Field of Search ............... 324/72.5, 158 P, 158 F, 324/158 R, 73.1; 437/8; 439/482; 371/25.1, 15.1

[56] References Cited

U.S. PATENT DOCUMENTS

| | | | |
|---|---|---|---|
| 4,038,599 | 7/1977 | Bove et al. | 324/73.1 |
| 4,520,314 | 5/1985 | Asch et al. | 324/72.5 |
| 4,799,009 | 1/1989 | Tada et al. | 324/158 P |
| 4,928,278 | 5/1990 | Otsuji et al. | 371/25.1 |
| 4,961,052 | 10/1990 | Tada et al. | 324/158 P |
| 4,965,865 | 10/1990 | Trenary | 324/158 P |

FOREIGN PATENT DOCUMENTS 0055958 2/1990 Japan ............................. 324/158 P

OTHER PUBLICATIONS

"Membrane Probe Card Technology (The Future For High Performance Wafer Test)", by Leslie et al., 1988 International Test Conference, 1988 IEEE, Paper 30.1, pp. 601–607.
"Very High Density Probing", by Barsotti et al., 1988 International Test Conference, 1988 IEEE, Paper 30.2, pp. 608–614.
"A Single-Chip LSI High-Speed Functional Tester", by Miyamoto et al., IEEE Journal of Solid-State Circuits, vol. SC-22, No. 5, Oct. 1987, pp. 820–828.

Primary Examiner—Kenneth A. Wieder
Assistant Examiner—Vinh P. Nguyen
Attorney, Agent, or Firm—James C. Kesterson; Douglas A. Sorensen; Richard L. Donaldson

[57] ABSTRACT

A full wafer integrated circuit testing device (10) tests integrated circuits (15) formed as a wafer in conjunction with a test control unit (40). Probe units (14) associate with respective integrated circuits (15). Probe tips (16) on probe units (14) communicate with respective pads (19) with the integrated circuits (15). Interface circuitry (36) selectively communicates test data between the test control unit (40) and the integrated circuit (15). Test pins (16) have positions on probe units (14) associated with respective integrated circuit connection points (19) for testing associated integrated circuit (15) components. Interface circuitry (36) includes comparators (54 and 56) that compare signals between the integrated circuit (15) and the test control unit (40). Memory components (66 and 68) store data associated with signals from test control unit (40) and said integrated circuit (15). Compliant material (32) assures that probe tips (16) throughout probe card (10) positively and conductively engage integrated circuit pads (19) of all associated integrated circuits (15) of a wafer.

32 Claims, 4 Drawing Sheets

FIG. 3

FULL WAFER INTEGRATED CIRCUIT TESTING DEVICE

TECHNICAL FIELD OF THE INVENTION

This invention relates generally to a full wafer integrated circuit testing device and, more particularly, to an apparatus and method for simultaneously testing all chips on a semiconductor wafer.

BACKGROUND OF THE INVENTION

Semiconductor device manufacturers fabricate integrated circuit ("IC") chips by printing many dies on a semiconductor wafer. Both during and following fabrication, a semiconductor chip manufacturer will test the integrated circuit chips to determine that it satisfies design specifications. Known semiconductor wafer testing methods are time consuming, because the manufacturer typically tests each integrated circuit chip one after the other to determine whether the integrated circuit chip satisfies design electrical connectivity, electronic functionality and performance requirements.

These processes involve placing a test probe in electrical contact with an integrated circuit chip to send and receive test signals from a test control unit. Once the test control unit fully tests the integrated circuit chip, the probe moves to the next integrated circuit chip on the wafer. The number of test probe movements necessary to test the tens or perhaps hundreds of integrated circuit chips on a single semiconductor wafer make testing time constitute a significant portion of integrated circuit chip fabrication costs. For example, in many integrated circuit memory chip manufacturing processes, as much as 25-30% of the processing costs relate to integrated circuit chip testing at the one megabyte level of integration. With more complex integrated circuit chip circuits, testing costs can be even higher. If a testing method or apparatus could significantly reduce the speed of integrated circuit chip testing, then this percentage of processing costs could drastically reduce. Thus, there is a need for a more rapid method of testing integrated circuit chips on a semiconductor wafer.

In an effort to decrease the time of testing integrated circuit chips on the same semiconductor wafer, some manufacturers use two or more test probes to simultaneously test two or more integrated circuit chips at a time. While this increases, to some degree, the integrated circuit chip testing speed, this method suffers from several limitations. For a number of reasons, a known multiple probe heads method can use no more than eight test probes at a time. Therefore, only as much as an eight-fold increase in speed is achievable using multiple test probe heads.

Another multiple probe limitation resides in the fact that known test probes contain no remote data processing or storage capability. Because all data processing and test control capability for integrated circuit chip testing resides with the test control unit, in known test methods a test control unit can only control one test head at a time. Consequently, if a semiconductor device manufacturer desires to use the method of testing two integrated circuit chips at one time, then two testing computers are necessary. integrated circuit chip test control computers are expensive machines to purchase and operate, so purchasing multiple test control computers to test additional integrated circuit chips simultaneously generally is not cost effective. A need exists, therefore, for an economical method and apparatus to test a plurality of integrated circuit chips without the additional need of multiple testing control units.

Another limitation in conventional integrated circuit chip testing methods relates to wire bonding techniques that known test probes employ. Conventional test probes mount to an epoxy board that has lead wires to electrically connect the test probe to test control unit hardware. The lead wires bond to the epoxy board and connect to metal pins on the test probe. The metal pins engage "pads" on the integrated circuit chip. Each of the integrated circuit chips pads provides a connection for an integrated circuit chip power or signal input or output. There are practical limits to the size and number of lead wires that an integrated circuit test probe can contain. For example, a typical integrated circuit memory chip uses between 20 and 40 pads. Therefore, the test head must include between 20 and 40 lead wires for each integrated circuit chip it will test. If a semiconductor wafer contains as many as 300 typical integrated circuit memory chips, for example, then the test probe must have as many as 9,000 lead wires (=300 chips×30 lead wires/chip) bonded to the epoxy board and running between the test probe pins and the test control unit contacts.

This requirement far exceeds the epoxy board wire bonding process technique capabilities that conventional test probe heads employ. If a way existed to avoid this test probe lead wire problem, then a manufacturer may address more effectively the other problems relating to increasing integrated circuit chip testing speed. Thus, there is a need for an integrated circuit chip testing method and apparatus that more effectively permits testing multiple integrated circuit chips on a single semiconductor wafer without their lead wire design problem.

Yet another limitation respecting known test devices is that with conventional probe head structures signal propagation speeds are limited due to large inductance of the probe wires. This limitation further restrains the multiple integrated circuit testing. If manufacturers desire to increase integrated circuit testing speed, this limitation must be overcome. Thus, there is a need for a method and apparatus can test many integrated circuits at one time without the speed restrictions from lead wire impedance.

SUMMARY OF THE INVENTION

The present invention, accordingly, provides an apparatus and method for semiconductor device testing that substantially eliminate or reduce disadvantages and limitations associated with prior integrated circuit chip testing methods and devices. One aspect of the invention is an integrated circuit chip testing device for simultaneously testing all or a very large fraction of the integrated circuit chips on a semiconductor wafer and communicating test signals between a test control unit and the integrated circuit chips on the semiconductor wafer.

According to another aspect of the invention, there is provided a full wafer integrated circuit testing device that, in conjunction with a test control unit, tests integrated circuits formed as a wafer. Probe units on the testing are associated with respective integrated circuits. Probe tips on probe units communicate with respective pads of the integrated circuits. Interface circuitry within each probe unit selectively communicates test data between the test control unit and the integrated circuit that the probe unit tests. Test pins have positions on probe units associated with respective integrated circuit connection points for testing associated integrated circuit components. Interface circuitry can include comparators that compare signals between the integrated circuit and the test control unit. Memory components store data associated with signals from test control unit and said integrated circuit.

According to yet another aspect, the invention provides a full wafer integrated circuit testing device for testing a plurality of integrated circuits formed as a wafer in conjunction with a test control unit. The invention comprises a plurality of probe units formed on the wafer by integrated circuit fabrication processes and associated with respective integrated circuits. Each probe unit comprises a plurality of probe tips integrally mounted to the probe units and operable to communicate with respective nodes associated with the integrated circuit. Interface circuitry within the wafer selectively communicates test data between the test control unit and the integrated circuits.

A technical advantage of the present invention is that it permits simultaneously testing all or a very large fraction of the integrated circuit chips on a single semiconductor wafer. The probe card physically contacts the semiconductor wafer only one or few times. Thus, when an integrated circuit chip on a semiconductor wafer fails testing, the present invention stores failed test data and permits the test control unit to identify the failed unit after the physical contact ceases. The information in the test control unit aids a manufacturer to determine whether to repair or discard particular integrated circuit chip.

Yet another technical advantage of the present invention is that it increases the speed of integrated circuit chip testing. Instead of the hundreds or thousands of mechanical operations that testing one integrated circuit chip at a time requires for a full wafer, the full wafer probe card of the present invention only requires one or a few mechanical operations for testing all integrated circuit chips on a semiconductor wafer. This can significantly increase integrated circuit chip testing speed, and therefore, reduce the expense of integrated circuit chip testing.

Yet another technical advantage of the present invention is its ability to test integrated circuits on a semiconductor wafer that have two-dimensional pad arrays. This further increases the speed and flexibility of integrated circuit testing over known testing methods and devices.

A further technical advantage of the present invention is that it allows very high frequency test data transmission rates. This is because the distance between the test circuit and the integrated circuit is very short, thereby, eliminating much of the parasitic capacitance and inductance of known test heads.

BRIEF DESCRIPTION OF THE DRAWINGS

The invention itself, however, as well as modes of use and further advantages is best understood by reference to the following description of illustrative embodiments when read in conjunction with the accompanying drawings.

DETAILED DESCRIPTION OF THE INVENTION

Figure 1:
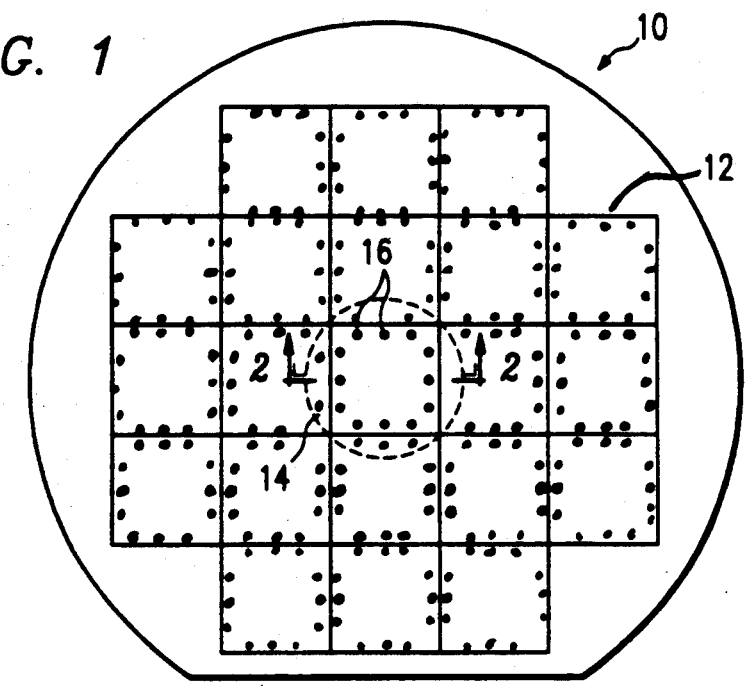
FIG. 1 is a top view of the full wafer probe card containing a plurality of probe units according to a preferred embodiment of the present invention.

The preferred embodiment of the present invention is best understood by referring to the drawings, like numerals being used for like and corresponding parts of the various drawings.

FIG. 1 shows a top view of the full wafer probe card 10 according to a preferred embodiment of the present invention. The full wafer probe card 10 comprises a probe unit die matrix 12 that comprises a plurality of individual probe units 14. Each individual probe unit 14 comprises a plurality of probe tips 16. Probe tips 16 mount to probe unit 14 and align to make electrical contact with integrated circuit chip pads that the probe card 10 tests. The function of the probe tips 16 is similar to the function of the probe pins or needles on conventional integrated circuit chip test probes. Thus, the number of probe tips 16 must at least equal the number of pads on the integrated circuit chip that the probe unit 14 tests. Also, the configuration of probe tips 16 must be a mirror image of the pad configuration of the integrated circuit chip for which the probe card will produce test results. The number of probe units 14 on a probe card 10 will equal the number of integrated circuit chips on the wafer to be tested.

Figure 2:
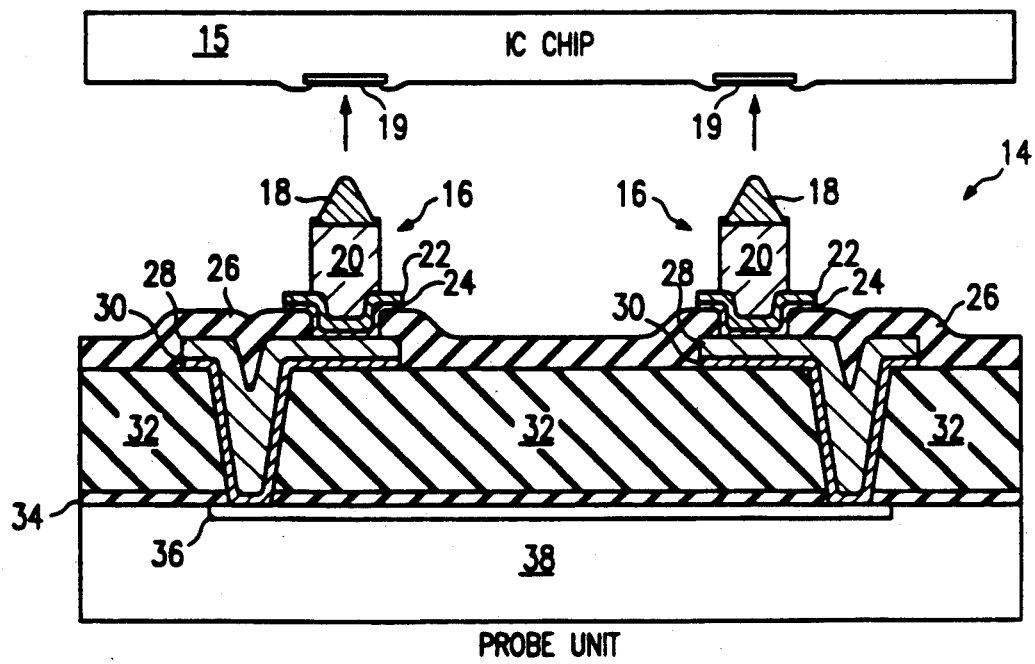
FIG. 2 is a cross-sectional view of a portion of a probe unit according to a preferred embodiment of the present invention.

FIG. 2 shows a partial cross-sectional view of a probe unit 14 of the full wafer probe card 10 according to a preferred embodiment of the present invention. Probe unit 14 includes a plurality of probe tips 16. Each probe tip 16 includes pointed tip 18 and metal bump 20. FIG. 2 also shows that probe unit 14 may engage an integrated circuit chip 15, for example, so that pointed tip 18 engages integrated circuit chip pad 19. Probe tip 16 rigidly attaches to connector cap 22 and connector base 24 that are bonded together and affix to protective coating 26. Connector base 24 makes electrical contact with metal contact 28 which conductive coating 30 surrounds within compliant material 32. Metal contact 28 and conductive coating 30 penetrate through insulating layer 34 to establish electrical contact with active element 36. Active element 36 comprises a diffused integrated circuit within silicon substrate 38.

Pointed tip 18 integrally mounts to metal bump 20 to establish an electrical contact between an integrated circuit chip pad 19 and metal bump 20. Typically, integrated circuit chip pad 19 has an aluminum base, which in the normal atmosphere forms an aluminum oxide layer over the pad. Pointed tip 18 comprises a hard conductive material, such as tungsten, and mounts to metal bump 20. Hard pointed tip 18 penetrates any aluminum oxide or other oxide layer that may exist on integrated circuit chip pad 19 to assure that a conductive metal-to-metal electrical connection exists between probe unit 14 and integrated circuit chip 15.

The preferred embodiment of the present invention uses gold as the base material for metal bump 20. Any materials having hardness and conductive properties similar to gold, however, may substitute for the material. Connector cap 22 and connector base 24 comprise conductive materials that establish an electrical connection between metal contact 28 and probe tip 16. In the preferred embodiment, connector cap 22 comprises a gold metal, while connector base 24 is a layer of tungsten or material with similar electrical properties and strength. Protective coating 26 covers compliant material 32 and metal contact 28 to hold probe tip 16 securely in place. Protective coating 26 may comprise any number of compliant materials having sufficient elastic, protective, and adhesive properties for the purposes of the present invention. The preferred embodiment, however, uses polyimide materials Hitachi PIQ-3600 or DuPont 2611.

V-shaped metal contacts 28 are an aluminum material and embed through the compliant material 32 and insulating layer 34 to make electrical contact with active element 36. Compliant material 32 gives probe card 10 flexibility to ensure that, as probe card 10 engages a semiconductor wafer, probe tips 16 make a strongly conductive metal contact with all pads of the integrated circuit chips on the silicon wafer. Thus, compliant material 32 assures that probe tips 16 throughout the probe card 10 positively and conductively engage integrated circuit pads 19 of all integrated circuits 15 of a wafer. Insulating layer 34 will normally be silicon dioxide ($SiO_2$) material. This facilitates probe card 10 fabrication, because a manufacturer can easily use the silicon substrate 38 to produce silicon dioxide layer 34.

Figure 3:
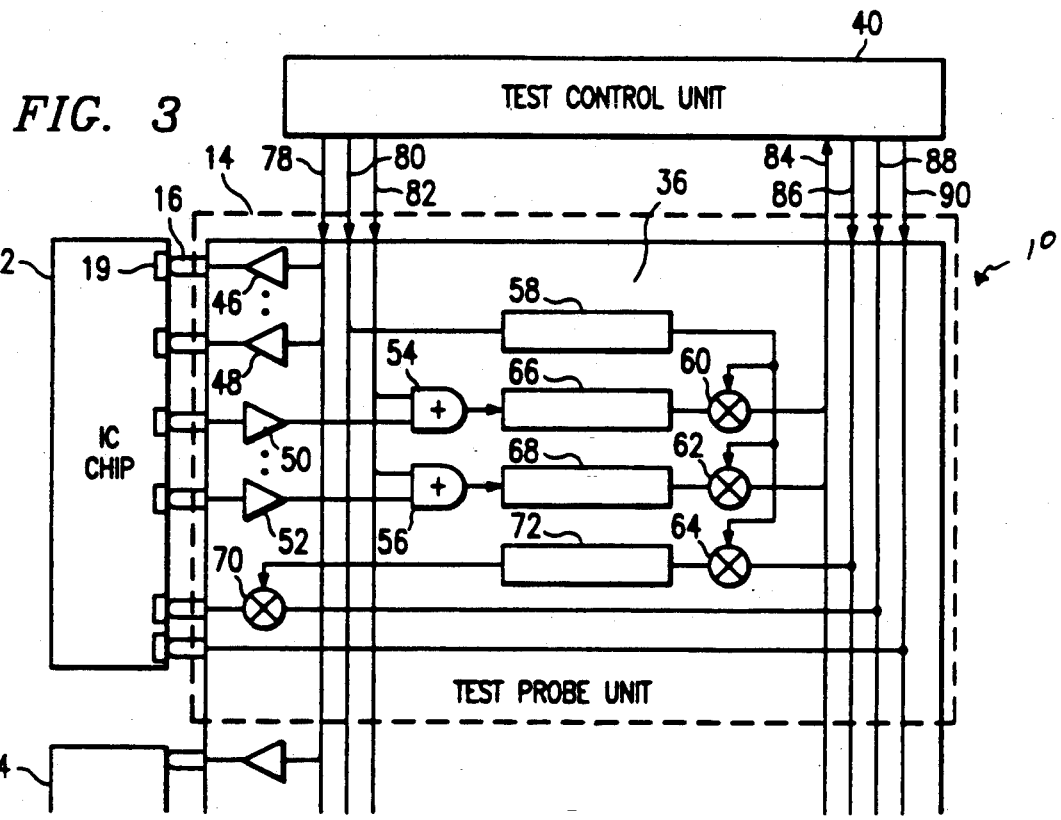
FIG. 3 is an electrical schematic diagram of a probe unit according to a preferred embodiment of the present invention.

FIG. 3 shows a schematic block diagram of how active element 36 functions within a probe unit 14 (surrounded by dash line). Test control unit 40 engages probe card 10, which connects to integrated circuit chips such as 42 and 44 via probe tips 16. Test signal buses that lead from test control unit 40 to probe card 10 include input signal bus 78, address bus 80, expected output bus 82, and fail code bus 84. Test power buses between test control unit 40 and probe card 10 include power fail bus 86, power bus 88, and ground bus 90. Signal repeaters such as 46 and 48 connect between input signal bus 78 and probe tips 16. Signal repeaters 50 and 52 communicate between probe tips 16 and comparators 54 and 56, respectively. Comparators 54 and 56 also tap from expected output bus 82 and connect to fail condition registers 66 and 68, respectively. Address decoder 58 connects to address bus 80. Switch elements 60 and 62 take inputs from address decoder 58 and fail condition register 66 and 68, respectively, to output bus 86 and send these inputs to failed condition register 72. Failed condition register 72 connects power switch 70, which also taps from power bus 88, to probe tips 16. Ground bus 90 leads to probe tips 16.

Referring again to FIG. 3, integrated circuit testing with the present invention will be explained. Test control unit 40 sends integrated circuit test input signals to input signal bus line 78. Signal repeaters 46 and 48 receive and amplify or level shift these signals and, then send the amplified signals via probe tips 16 to integrated circuit chip 42. Integrated circuit chip 42 responds to these signals with output signals that signal repeaters 50 and 52 receive through a different set of probe tips 16. Signal repeaters 50 and 52 amplify these output signals and send them to comparators 54 and 56.

Comparators 54 and 56 also receive expected output signals from expected output bus 82. Expect output signals represent the signals that a fully functional integrated circuit would send to signal repeaters 50 and 52, respectively. Comparators 54 and 56 compare these signals from expected output bus 82 to the actual signals from signal repeaters 50 and 52 to determine if the signals match, thus indicating a fully functional integrated circuit. If no match occurs, however, the comparator 54 or 56 (or both) in which that condition exists will send a fail signal to fail condition register 66 or 68, as appropriate. Fail condition registers 66 and 68 each has a memory for temporarily storing these signals from the comparator 54 and 56, respectively.

Address decoder 58 allows test control unit 40 to selectively address the individual probe unit 14 within which the address decoder 58 resides. To do this, test control unit 40 sends a coded signal to address bus 80. The coded signal goes to all address decoders simultaneously, since they are all connected in parallel to address bus 80. When the coded signal comprises the address for a particular probe unit 14, address decoder 58 of the particular probe unit 14 responds to decode the coded signal. With the decoded signal, address decoder 58 activates either or both swith elements 62 and 64. In response to activation by address decoder 58, switch elements 62 and 64 permit fail condition registers 66 and 68, respectively, to send any fail condition signals they may be storing to fail code bus 84. Fail code bus 84, in turn, relays this data to test control unit 40.

Based on the number of failed cells within the integrated circuit chip being tested, test control unit 40 will send a signal to failed condition register 72 to indicate a failed chip condition. Also if test control unit 40 observes an abnormally high or low current from integrated circuit chip 42, test control unit 40 will send a failed chip signal to failed condition register 72. Failed condition register 72 will, in turn, transmit a signal to power bus switch 70 turn power off from test control unit 40. When this happens, test signal data communication between integrated circuit chip 42 and probe unit 14 ceases. This allows more efficient use of test control unit 40 capability to identify the functional condition of remaining integrated circuit chips on the semiconductor wafer.

The present invention may interface with presently available test control units. The only hardware modification necessary to implement the present invention is to substitute the conventional individual integrated circuit chip testing probe card with the full wafer probe card of the present invention. Thus, the conventional chuck or holding apparatus for an individual integrated circuit chip test may also hold the full wafer probe card of the present invention to establish communication between the probe units and the test control unit. To use the present invention, however, the manufacturer must reprogram the test control unit to accommodate the data communication requirements of the full wafer probe card. For example, typically a test control unit for integrated circuit chip testing only processes information from one integrated circuit chip at a time. Within this limitation of known test control units, the full wafer probe card of the present invention has data storage and communication capabilities within active element 36 that known test probes do not offer.

Figure 4A:
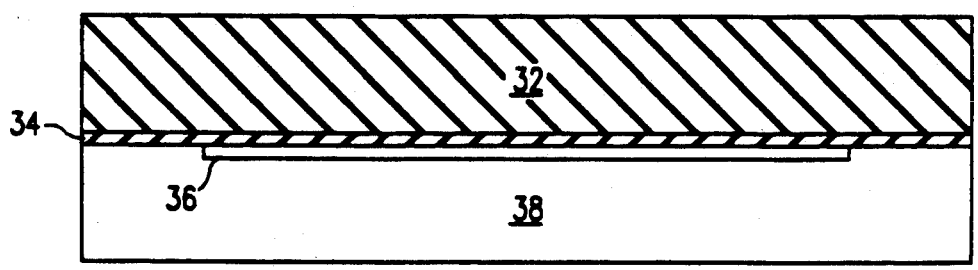
FIGS. 4a through 4h depict a method of manufacturing the full wafer probe card according to a preferred embodiment of the present invention.

FIGS. 4a through 4h demonstrate the fabrication techniques that are useful to produce a preferred embodiment of the present invention. Initial substrate layers, as FIG. 4a illustrates, include compliant material 32 as a first layer and $SiO_2$ layer 34 as a second layer. Active element 36 fits beneath $SiO_2$ layer 34 and fully within silicon substrate 38. The first steps in the manufacturing process of the full wafer probe card 10 of the present invention, therefore, is to fabricate and adhere these layers as FIG. 4a shows.

Figure 4B:
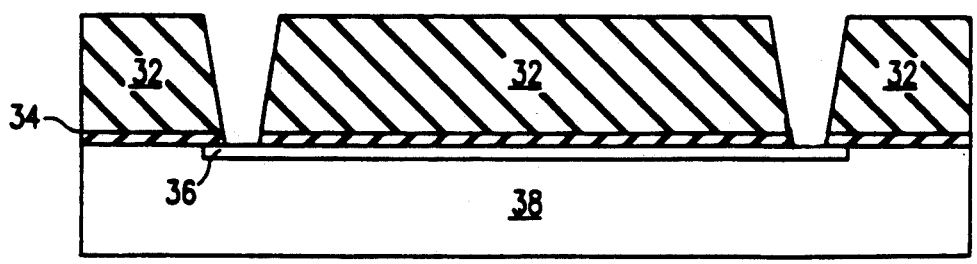

SiO$_2$ layer 34 and active element 36 are formed using standard fabrication processes a manufacturer can apply to silicon substrate 38. Compliant material 32, in the preferred embodiment, comprises a polyimide layer such as Hitachi PIQ-3600 or DuPont 2611, which can bond to SiO$_2$ layer 34 according to known fabrication techniques. The compliant material 32 is formed on top of silicon dioxide layer 34 using spin-coating techniques. Using a photomask and photoresist combination metal contact 28 openings and are patterned and etched in the polyimide material (FIG. 4b).

Figure 4C:
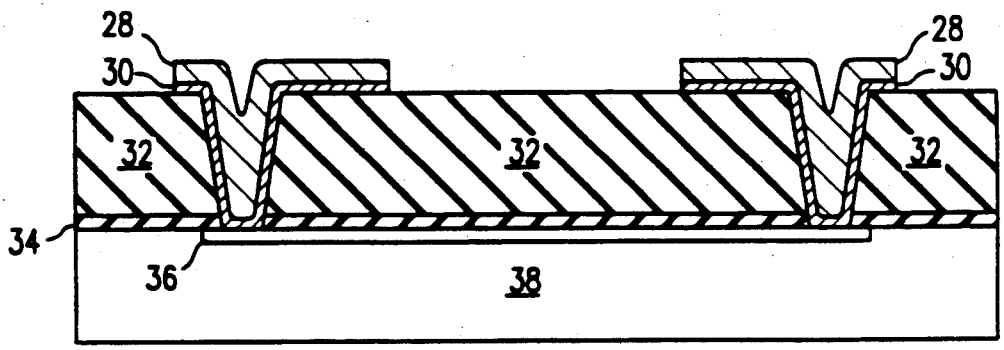

FIG. 4c shows metal contact 28 and conductive coating 30 within compliant material 32. To achieve this result, the process calls for sputtering first tungsten, and then aluminum, or alternatively, electroplating metals to create conductive layer 30 and metal contact 28, respectively.

Figure 4D:
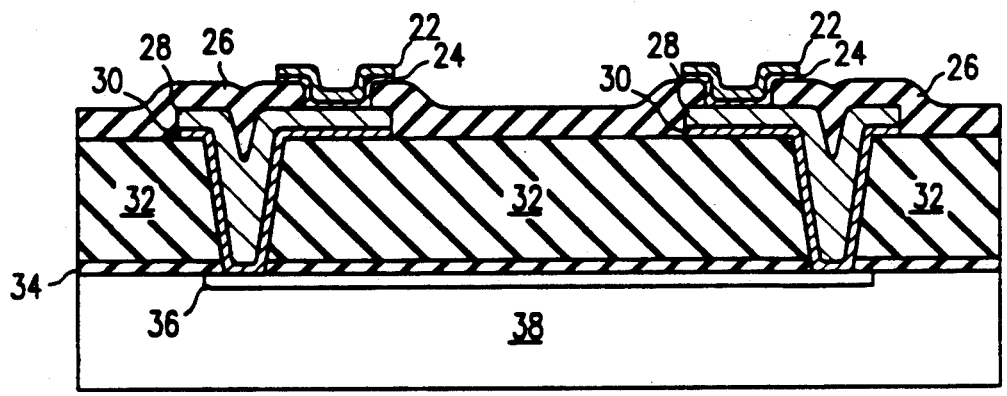

In FIG. 4d, the compliant material 32 surface is covered with a PECVD-applied oxide or compliant polymer to establish protective coating 26 for the compliant material and metal contacts. The next step is to etch the protective coating 26 to form windows to the metal contacts 26 and to sputter a tungsten seed layer over the oxide layer or compliant polymer to form connector base 24 in the windows. The next process step is to sputter gold metal connector caps 22 over tungsten connector base 24 (FIG. 4d).

Figure 4E:
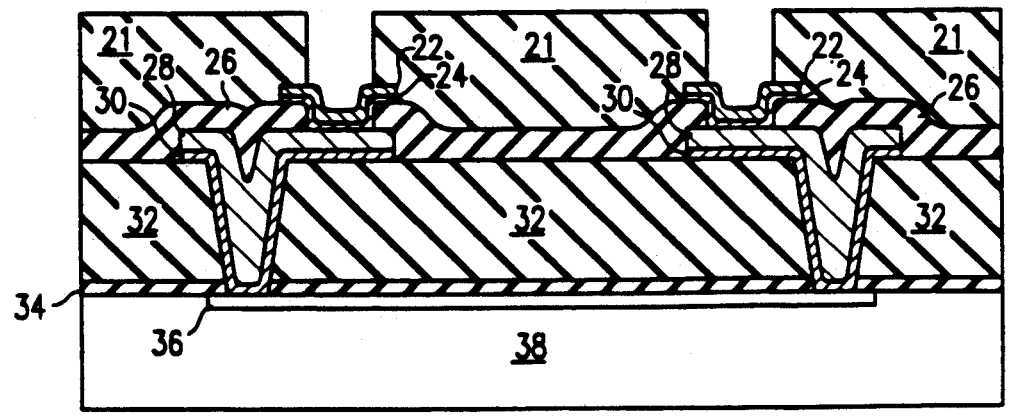

In FIG. 4e, a polyimide layer or a thick photoresist 21 (approximate thickness of 50 μm) is formed over the connector caps 22 and protective layer 26 using spin coating techniques. Windows are etched in layer 21 for probe tips 16.

Figure 4F:
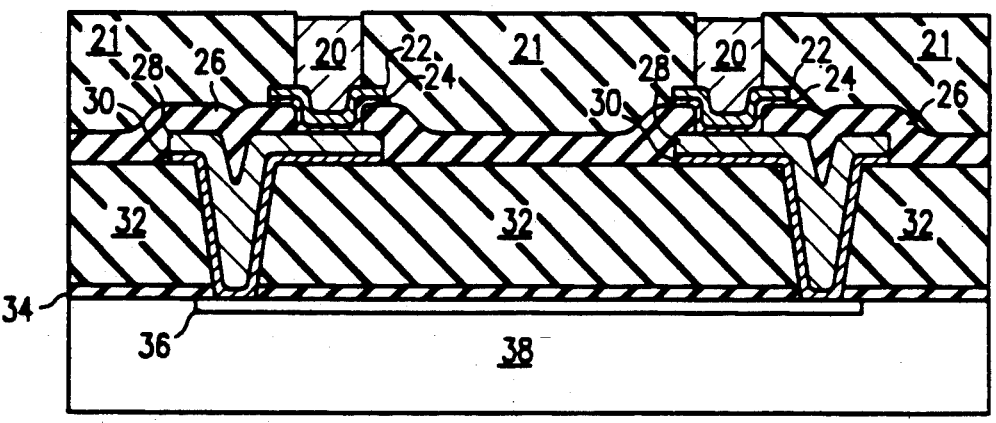
Figure 4G:
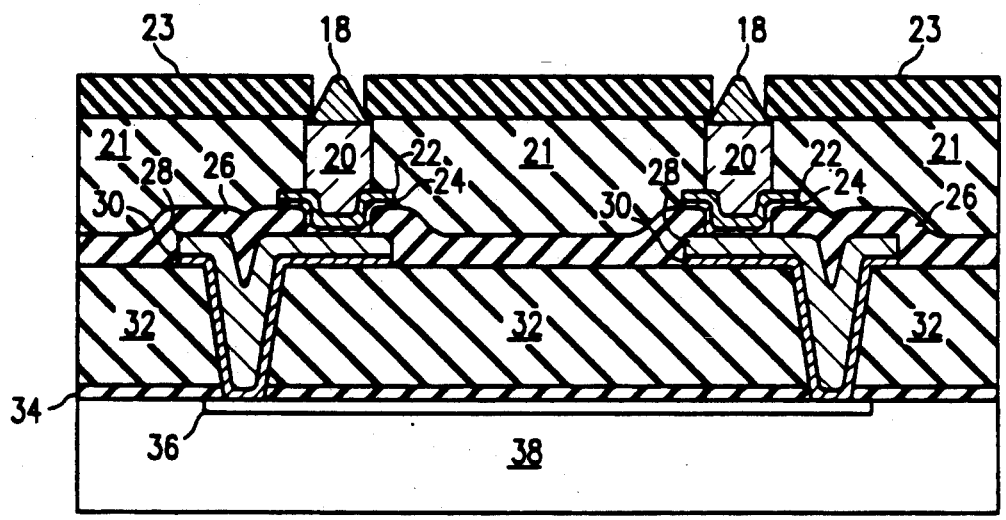
Figure 4H:
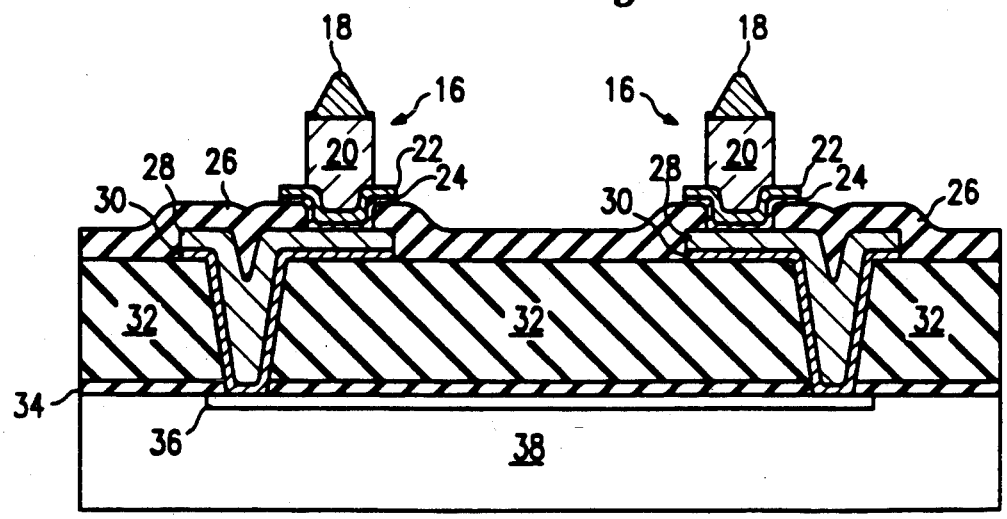

In FIG. 4f, gold metal bumps 20 are formed in the etched out area the etched out spaces of polyimide layer 21 using electroplating or electroless plating techniques. In FIG. 4g, after first putting photoresist 23 on polyimide layer 21 and etching off an area to receive probe tip 16, a layer of tungsten or tungsten-gold alloy is sputtered to produce pointed tip 18 of probe tip 16 using one of several possible lift-off techniques. Finally, the polyimide or photoresist layer 21 and photoresist 23 are removed to yield the preferred embodiment of the present invention shown in FIG. 4h.

Although the invention has been described with reference to the above specific embodiments, this description is not meant to be construed in a limiting sense. Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. An integrated circuit testing device simultaneously connected to a plurality of subject integrated circuits for testing substantially all of said plurality of subject integrated circuits formed on a semiconductor wafer, said testing device connected to and operating in conjunction with a test control unit, said testing device comprising:
   a support wafer;
   a plurality of probe units formed on said support wafer, each one of said plurality of probe units for testing respective ones of said plurality of subject integrated circuits and comprising a plurality of probe tips operable to communicate with respective nodes associated with a respective subject integrated circuit; and
   at least one active interface ciruucit formed on said support wafer and connected between said test control unit and said probe units for selectively controlling data transmitted between the test control unit and the subject integrated circuits.

2. The device of claim 1, wherein each of said probe tips on each of said probe units connects in parallel with an associated probe tip on another probe units, each of said probe tips capable of receiving in parallel a test signal from the test control unit.

3. The device of claim 1, wherein said active interface circuit further comprises at least one amplifier for communicating and amplifying signals between the subject integrated circuit and the test control unit.

4. The device of claim 1, wherein said active interface circuit further comprises at least one comparator for generating an output by comparing signals between the subject integrated circuit and the test control unit.

5. The device of claim 1, wherein said active interface circuit further comprises at least one memory component associated with said probe units for storing data associated with signals from said test control unit and said integrated circuit.

6. The device of claim 5, wherein said active interface circuit comprises at least one comparator for generating an output by comparing signals between the subject interface circuit and the test control unit, and wherein said memory component further comprise storage capability for storing said comparator output.

7. The device of claim 5, wherein said memory component further connects to an output bus for communicating an output between said active interface circuit and the test control unit.

8. The device of claim 7, wherein said output bus further comprises circuitry for communicating an output from said memory components and the test control unit.

9. The device of claim 1, further comprising a power bus for providing test power to the subject integrated circuit.

10. An integrated circuit testing device simultaneously connected to a plurality of subject integrated circuits for testing substantially all of a plurality of subject integrated circuits formed on a semiconductor wafer, said testing device connected to and operating in conjunction with a test control unit, said testing device comprising:
    a support wafer;
    a plurality of probe units formed on the support wafer by integrated circuit fabrication processes, each one of said plurality of probe units for testing respective ones of said plurality of subject integrated circuits and comprising a plurality of probe tips integrally mounted to said probe units and operable to communicate with respective nodes associated with a respective integrated circuit; and
    at least one active interface circuit formed within the wafer and connected between said test control unit and said probe unit for selectively processing data transmitted between the test control unit and the subject integrated circuits.

11. The integrated circuit testing device of claim 10, wherein the support wafer includes a silicon substrate for forming said active interface circuit.

12. The integrated circuit testing device of claim 11, further comprising an insulating layer affixed to said silicon substrate and said active interface circuit and a compliant material over said insulating layer, said compliant material assuring that said probe tips positively and conductively engage associated subject integrated circuits pads.

13. The integrated circuit testing device of claim 12, further comprising a plurality of metal contacts imbedded within said compliant material and penetrating said insulating layer to communicate with said active interface circuit.

14. The integrated circuit testing device of claim 13, further comprising a plurality of probe tips wherein each of said probe tips are mounted to one of said plurality of metal contacts for contacting nodes of the subject integrated circuit.

15. The integrated circuit testing device of claim 14, wherein each of said probe tips further comprises a metal bump connected to said metal contact for making electrical contact with the subject integrated circuit.

16. The integrated circuit testing device of claim 15, wherein said metal bump further comprises a pointed tip affixed to said metal bump, said pointed tip comprising a hard conductive material to assure conductive contact between said probe unit and the integrated circuit.

17. The integrated circuit testing device of claim 10, wherein said active interface circuit further comprising communication circuitry for communicating signals between the subject integrated circuit and the test control unit and a memory for storing signals from the subject integrated circuit.

18. The integrated circuit testing device of claim 17, wherein said active interface circuit comprises comparator circuitry connected to said communication circuitry for comparing a plurality of signal outputs from the subject integrated circuit to expected outputs and address circuitry for identifying the origin of said signal outputs.

19. The integrated circuit testing device of claim 17, wherein said active interface circuit includes failed subject integrated circuit component circuitry for providing data to the test control unit indicative of failed integrated circuit components.

20. The integrated circuit testing device in claim 17, wherein said active interface circuit further comprises failed subject integrated circuit circuitry for responding to a failed integrated circuit signal from the test control unit.

21. The integrated circuit testing device of claim 17, wherein said active interface circuit further includes a power bus switch connected to a power bus for providing power to the subject integrated circuit.

22. The integrated circuit testing device of claim 21, wherein said active interface circuit further comprises failed integrated circuit circuitry for responding to a failed subject integrated circuit signal from the test control unit and wherein said power bus switch further connects to said failed circuitry for turning off power to the subject integrated circuit in the event said failed circuitry receives a failed signal.

23. The integrated circuit testing device of claim 17, further comprising a ground bus connected to the subject integrated circuit and the test control unit for providing a reference voltage level for input and output signals.

24. An integrated circuit testing system for testing substantially all integrated circuits on a single semiconductor wafer, comprising:
a test control unit for generating and receiving test signals;
an integrated circuit testing device simultaneously connected to a plurality of subject integrated circuits for testing substantially all of said subject integrated circuits formed on a wafer, said testing device connected to and operating in conjunction with said test control unit, said integrated circuit test device comprising:
a support wafer;
a plurality of probe units formed on said support wafer, each one of said plurality of probe units for testing respective ones of said plurality of subject integrated circuits and comprising a plurality of probe tips operable to communicate with respective nodes associated with a respective integrated circuit; and
at least one active interface circuit formed on said support wafer and connected between said test control unit and a probe unit for selectively controlling data transmitted between the test control unit and the subject integrated circuits.

25. A method of integrated circuit testing for testing substantially all of a plurality of subject integrated circuits formed as a wafer in conjunction with a test control unit, comprising:
communicating between nodes associated with each of the subject integrated circuits and a plurality of probe units formed on a support wafer, said probe units associated with each of the respective integrated circuits; and
selectively controlling the transmission of data between the test control unit and the subject integrated circuits.

26. The method of claim 25, wherein said controlling step further comprises the step of using a plurality of test pins on said probe units to test associated subject integrated circuit components.

27. The method of claim 26, wherein said step of using test pins further comprises the step of connecting those test pins on at least two of said probe units selected to perform the same test in parallel.

28. The method of claim 25, wherein said selective controlling step further comprises the steps of amplifying and repeating signals between the subject integrated circuits and the test control unit.

29. The method of claim 25, wherein said selective controlling step further comprises the step of generating an output by comparing signals between the subject integrated circuit and the test control unit.

30. The method of claim 25, wherein said selective controlling step further comprises the step of storing data associated with signals from the test control unit and the subject integrated circuit.

31. The method of claim 30, wherein said selectively controlling step further comprises the step of generating an output by comparing signals between the test control unit and the subject integrated circuit and wherein said data storing step further comprises the step of storing said comparator output.

32. The method of claim 30, wherein said selective controlling step further comprises the step of communicating stored data to the test control unit.

* * * * *